United States Patent
Takahashi et al.

[11] Patent Number: 5,736,462
[45] Date of Patent: Apr. 7, 1998

[54] METHOD OF ETCHING BACK LAYER ON SUBSTRATE

[75] Inventors: Hiroshi Takahashi; Kazuhiko Tokunaga; Shunichi Yoshigoe, all of Kanagawa, Japan

[73] Assignee: Sony Corporation, Tokyo, Japan

[21] Appl. No.: 638,205

[22] Filed: Apr. 26, 1996

[30] Foreign Application Priority Data

May 15, 1995 [JP] Japan ................. 7-116069
Nov. 22, 1995 [JP] Japan ................. 7-304408

[51] Int. Cl.$^6$ ......................... H01L 21/336
[52] U.S. Cl. ............... 438/692; 438/694; 438/700; 438/702; 438/424; 438/425
[58] Field of Search ................. 437/228, 978, 437/67; 216/88, 80, 19; 156/636.1, 648.1, 345; 148/50; 438/692, 694, 700, 702, 424, 425

[56] References Cited

U.S. PATENT DOCUMENTS

| | | | |
|---|---|---|---|
| 3,911,562 | 10/1975 | Youmans | 29/590 |
| 4,666,556 | 5/1987 | Fulton et al. | 156/643 |
| 5,096,550 | 3/1992 | Mayer et al. | 204/129.1 |
| 5,229,316 | 7/1993 | Lee et al. | 437/67 |
| 5,246,884 | 9/1993 | Jaso et al. | 437/225 |
| 5,376,222 | 12/1994 | Miyajima et al. | 156/636 |
| 5,441,094 | 8/1995 | Pasch | 156/636.1 |
| 5,491,113 | 2/1996 | Murota | 437/225 |
| 5,500,558 | 3/1996 | Hayashide | 257/758 |
| 5,510,652 | 4/1996 | Burke et al. | 257/752 |
| 5,561,078 | 10/1996 | Taskaka | 437/67 |

FOREIGN PATENT DOCUMENTS

| | | | |
|---|---|---|---|
| 60-39835 | 7/1985 | Japan . | |
| 3-11091 | 3/1991 | Japan . | |
| 5-218000 | 8/1993 | Japan . | |
| 6-45432 | 2/1994 | Japan . | |
| 6-124932 | 5/1994 | Japan | 21/304 |
| 6-163489 | 6/1994 | Japan | 21/304 |

*Primary Examiner*—R. Bruce Breneman
*Assistant Examiner*—Julie Stein
*Attorney, Agent, or Firm*—Ronald P. Kananen

[57] ABSTRACT

An intermediate layer is formed on a portion which becomes a projecting portion of a step difference formed on a semiconductor substrate, a layer to be polished having a slower polishing rate than the intermediate layer is formed to cover intermediate layer and fill a recessed portion of the step difference, and then polishing is carried out over an area from this layer to be polished to the intermediate layer. Further, it is also possible to form a stopper layer having a slower polishing rate than the layer to be polished under the intermediate layer. In the polishing, a fluctuation of the rotational torque of the polishing machine of a predetermined value or more or an interference color may be used for detection of the end point of polishing.

15 Claims, 8 Drawing Sheets

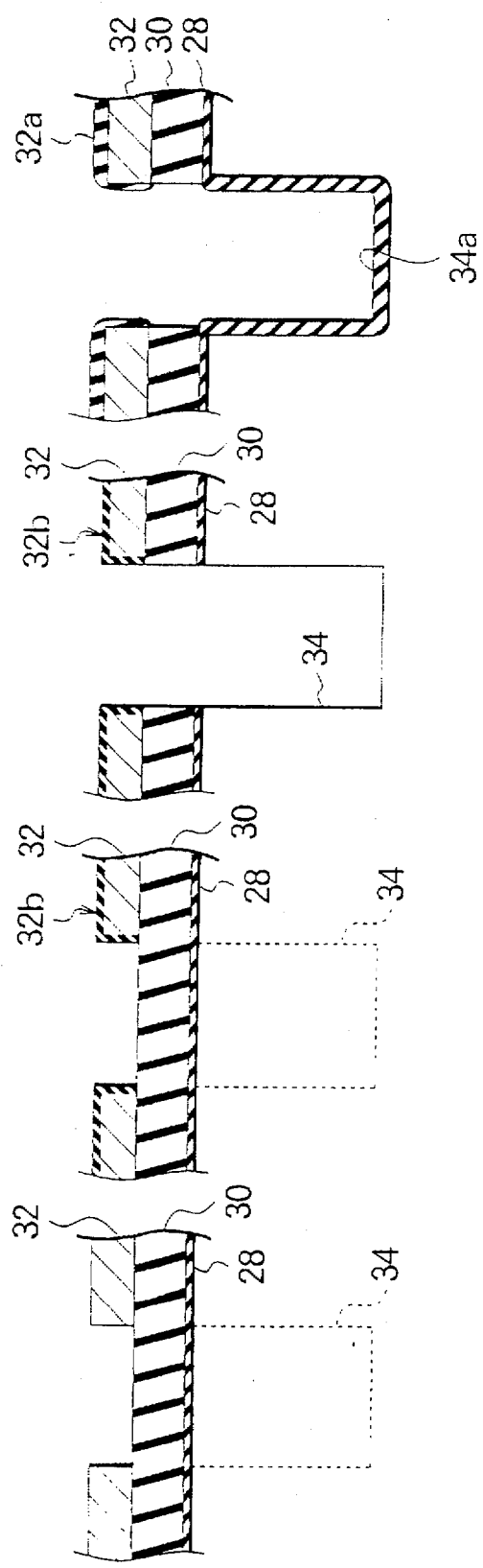

METHOD OF ETCHING BACK LAYER ON SUBSTRATE

BACKGROUND OF THE INVENTION

1. Field of the Invention

The present invention relates to a method of producing a semiconductor device, and more particularly relates to an end point control for polishing, for chemical mechanical polishing or for planarizing a step difference in a surface of a semiconductor substrate.

2. Description of the Related Art

Methods of planarizing step differences by chemical mechanical polishing have been generally used in recent years.

On the other hand, various methods have been attempted as a method for controlling the end point of the polishing, but in actuality there has been no decisive method found from the viewpoint of precision.

The methods for controlling the polishing end point which have been experimented with heretofore can be roughly classified into methods which do not detect the end point and methods detecting the end point.

As a method which does not detect the end point, most simply, the conditions are found in advance for the relationship between the time spent polishing and amount of polishing accomplished. The amount of polishing is then controlled by the time based on these conditions. The polishing cloth used for the chemical mechanical polishing, however, changes in its surface state due to wear. When the same polishing cloth is used, therefore, the polishing rate fluctuates. Accordingly, when the method of controlling the amount of polishing by only the time of polishing is used in a process in which strict end point control is required, such as, for example, trench element separation, a reduction in the manufacturing yield can not be avoided.

To strictly control the end point, it is required to improve the precision of the end point detection or, even if the end point is not to be detected, to devise some improved measure for controlling the amount of polishing.

Methods for detecting the end point include mainly a method of monitoring the rotational torque of the polishing machine, and a method for monitoring the thickness of the remaining film in parallel to the polishing.

The method of monitoring the rotational torque of the polishing machine generally involves monitoring the rotational torque by an electrical signal such as a current as shown in FIG. 1A. Numeral 2 denotes a wafer, 4 a carrier, 6 a lathe, 8 a motor, 10 a polishing cloth, and 12 an ammeter. Detailed description of the structure will be given later. This monitoring uses an electrical signal which does not change much at all during the time when the same film is being polished. For this reason, in order to detect the end point by this method, it is necessary to provide end point detection films having different polishing rates and to read the change of the electrical signal at the boundaries of the same.

On the other hand, in the method for monitoring the thickness of the remaining film in parallel to the polishing, since it is possible to control the thickness of the remaining film, it is advantageously not necessary to provide another film under the polished film. Accordingly, this method is an effective method for planarizing a single layer film. More specifically, as shown in FIG. 1B, the thickness of the remaining film is optically measured by a laser film thickness meter 14. To detect the polishing end point by such point measurement, however, variation in the surface must be suppressed to a certain extent. For this reason, when considering the variation of a semiconductor substrate and the polishing per se, a precision sufficient for practical use has not yet been obtained.

Next, in the method which does not detect the end point, to improve the finishing precision of the polishing, several methods have been tried using a film having a slow polishing rate as a stopper for the film to be polished. For example, these are disclosed in Japanese Unexamined Patent Publication (Kokai) Nos. 60-39835, 3-11091, 5-218000, and 6-45432. These methods include three cases, i.e., a case where the stopper film is provided at a projecting portion of a step difference, a case where it is provided at a recessed portion, and a case where it is provided on the entire surface. It was confirmed that a stopper film effectively acts to enhance the polishing uniformity in all cases.

In the above related arts, the most important factor is the selectivity of the polishing rates between the film to be polished and the end point detection film or the stopper film. This is because these films can be made to act more effectively when this selectivity is larger. With the end point detection film and stopper film which have been experimented with in the related arts, however, the selectivity has not been sufficient enough to enable use in a process in which strict end point control is required.

Giving a specific example, as the general film to be polished, a silicon oxide film formed by a CVD process is used, and as the end point detection film and stopper film in this case, a film having a slower polishing speed than the silicon oxide, for example, a silicon nitride film, is used. The selectivity at this time, that is, the ratio of the polishing rate of the silicon oxide film to that of the silicon nitride film, was about 3 to 5 times.

To further improve the selectivity, a film having a further slower polishing rate, that is, a hard film, is necessary. For this reason, films of ceramics such as boronitride films, films of diamond formed by the CVD process, and other films have been investigated, but these film-forming technologies, including also the hardware itself, still cannot be said to have been practically perfected.

SUMMARY OF THE INVENTION

The present invention has as its object to overcome the above disadvantages by providing a method of producing a semiconductor device which forms a structure which effectively detects the polishing end point and simultaneously has a stopper function with a large selectivity.

In consideration of the above disadvantages, the methods for producing a semiconductor device by planarizing the semiconductor substrate by polishing were considered. As a result, an intermediate layer was provided having a high polishing rate under the layer to be polished to effectively detect the polishing end point. By doing this, a large selectivity is provided between the layer to be polished and the intermediate layer and the precision of detection of the end point is raised.

The method for producing a semiconductor device according to the present invention includes at least a step of forming an intermediate layer on a portion which becomes a projecting portion of a step difference formed on a semiconductor substrate; a step of forming a layer to be polished having a slower polishing rate than the intermediate layer in a form covering the intermediate layer and filling the recessed portion of the step difference; and a step of performing the polishing over an area from the layer to be polished to the intermediate layer.

Further, by forming a stopper layer having a still larger selectivity under the intermediate layer, it is possible for the stopper layer to prevent further polishing and ensure a uniform shape after polishing. More specifically, first, a stopper layer made of a material having a slow polishing speed is formed on the portion which becomes the projecting portion of the step difference on the semiconductor substrate and an intermediate layer made of a material having a slow polishing speed is formed on this stopper layer. Thereafter, the layer to be polished is formed in a manner covering the intermediate layer and filling the recessed portion of the step difference.

To effectively detect the end point by utilizing this film structure, preferably the rotational torque of the polishing machine is monitored and a large fluctuation of the rotational torque is detected as the polishing end point. Along with the polishing from the layer to be polished to the intermediate layer, the rotational torque of the polishing machine fluctuates particularly near the boundaries of the films at which the polishing rates differ. This rotational torque may be monitored and a fluctuation of a predetermined value detected to determine the end point of the polishing.

The present invention is particularly suitable for the case of chemical mechanical polishing. Here, the words "chemical mechanical polishing" mean a method of polishing for chemically removing fine unevenness of the surface by a basic polishing agent simultaneously with mechanical polishing. This polishing method is excellent from the viewpoint that an extremely smooth surface is obtained. In chemical mechanical polishing, however, the chemical polishing is easily carried out at the projecting portions with relatively small pattern sizes. But, at projecting portions at which the pattern size is large, the polishing agent tends to penetrate insufficiently and the chemical polishing is difficult. For this reason, if there are step differences having different pattern sizes, a variation occurs in the amount of polishing. The variation of the amount of polishing becomes conspicuous particularly when polishing a layer having a slow mechanical polishing rate, that is, a hard layer, so a variation of the amount of polishing sometimes occurs when polishing the layer to be polished.

Once the intermediate layer having the slow polishing rate is exposed, however, polishing is carried out in a manner giving a smaller variation of the amount of polishing. While the polishing proceeds for the larger pattern size of the projecting portions protecting from the surface, projecting portions having a small pattern size are protected by the pattern of the projecting portions having a large size at their peripheries, so polishing becomes more difficult.

Once the variation of the amount of polishing is cancelled out during the polishing of the intermediate layer and the heights of the projecting portions become uniform, the polishing is uniformly carried out. Accordingly, if the thickness of the intermediate layer is made thick to a certain extent, at the point of time when the polishing is ended, the variation of the amount of polishing due to the difference of the size of the projecting portions is cancelled out and a surface having an extremely good planarity can be obtained.

Even if excessive polishing is carried out after this step, the stopper layer having a large selectivity effectively acts so that a surface shape having a good planarity is maintained. In addition, damage at the time of polishing to the surface of the projecting portion into which the device is formed later is prevented by the stopper layer and the intermediate layer.

It is also possible to detect the end point of polishing by the interference color which changes in accordance with the thickness of the remaining film of either of the intermediate layer or layer to be polished. In the step where the polishing is advanced, a taper is formed near, for example, the circumferential edge of the projecting portion for the film of either of the intermediate layer or the layer to be polished, and a color change appears due to the interference based on the thickness of the remaining film. The degree of this color change may, for example, be observed to detect the end point. Further, it is also possible to optically detect the interference color.

When the layer to be polished is silicon oxide, preferably the intermediate layer is made of polycrystalline silicon and the stopper layer is made of silicon nitride. Due to this, the intermediate layer can have a selectivity of 10 to 15 times with respect to the silicon oxide of the layer to be polished and 30 to 75 times with respect to the silicon nitride of the stopper layer.

This method for producing of a semiconductor device can be preferably used in the formation of trench element separation because, even in a case where the amount of polishing is large as in trench element separation, strict end point control can be carried out according to the present invention. In trench element separation, after this step, it is necessary to remove the stopper layer; however, at the removal of this stopper layer, the protective layer protects the surface of the semiconductor substrate. Accordingly, the surface of the semiconductor substrate is not etched or does not become roughened.

In trench element separation, when the layer to be polished is silicon oxide, preferably the intermediate layer is made of a BPSG film and the stopper layer is made of a silicon nitride film. In trench element separation, for the purpose of improving the separation characteristic by making the boundary surface between the trench and the substrate stable, the inner wall of the trench is sometimes thinly thermally oxidized before an insulating substance (layer to be polished) is buried in the trench. Where a polycrystalline silicon film and so forth is used as the intermediate layer, at this thermal oxidation, the oxide film is expanded and projects out at the side wall of the polycrystalline silicon film, which narrows the opening. Then, in the next step where the interior of the fine trench is filled with the layer to be polished, the inlet thereof is closed before the interior of the trench is completely filled with the layer to be polished and so a void is sometimes formed in the internal portion. The BPSG film and silicon nitride film are almost never oxidized, so the generation of this void can be effectively prevented.

For a similar reason, the intermediate layer used for the trench element separation is preferably subjected to processing of the lower layer film after nitriding the exposed surface after formation of the pattern thereof.

This is because, by preliminarily nitriding the exposed surface of the intermediate layer, oxidation of the intermediate layer at the thermal oxidation can be suppressed.

BRIEF DESCRIPTION OF THE DRAWINGS

These and other objects and features of the present invention will become clearer from the following description of the preferred embodiments given with reference to the attached drawings, in which:

FIGS. 1A and 1B are views of a chemical mechanical polishing apparatus of the related art, wherein FIG. 1A shows the chemical mechanical polishing apparatus of the related art which does not use an end point control procedure and which can be used for the working of the present invention; and FIG. 1B shows a chemical mechanical polishing apparatus of the related art which uses an end point control procedure different from that of the present invention;

FIG. 3A shows current for a case which has no intermediate layer, and FIG. 3B shows current for a case which has an intermediate layer;

FIGS. 7A to 7D are schematic sectional views of the configuration showing a third embodiment of the present invention.

DESCRIPTION OF THE PREFERRED EMBODIMENTS

Below, a detailed explanation is provided for a method for producing a semiconductor device of the present invention with reference to the drawings.

Figure 1A:
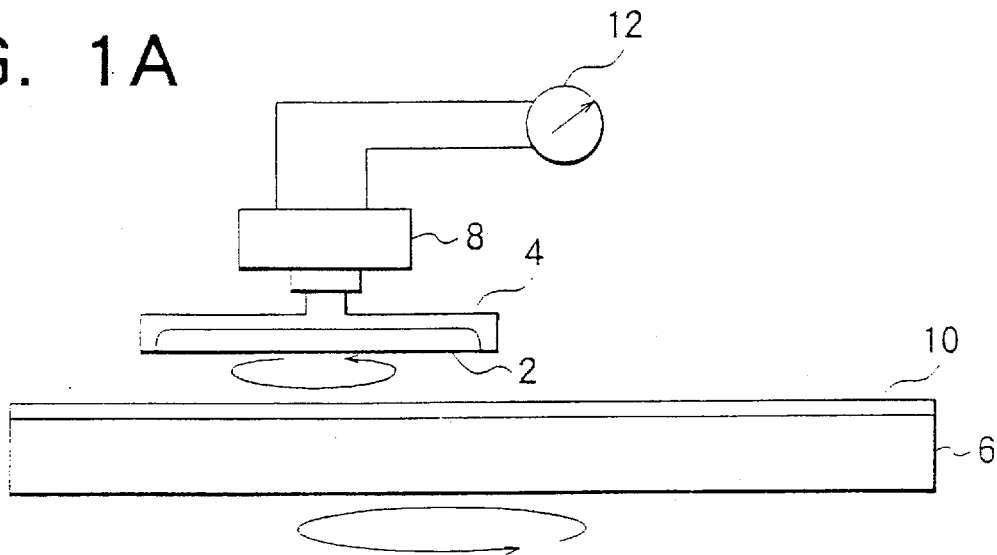
Figure 1B:
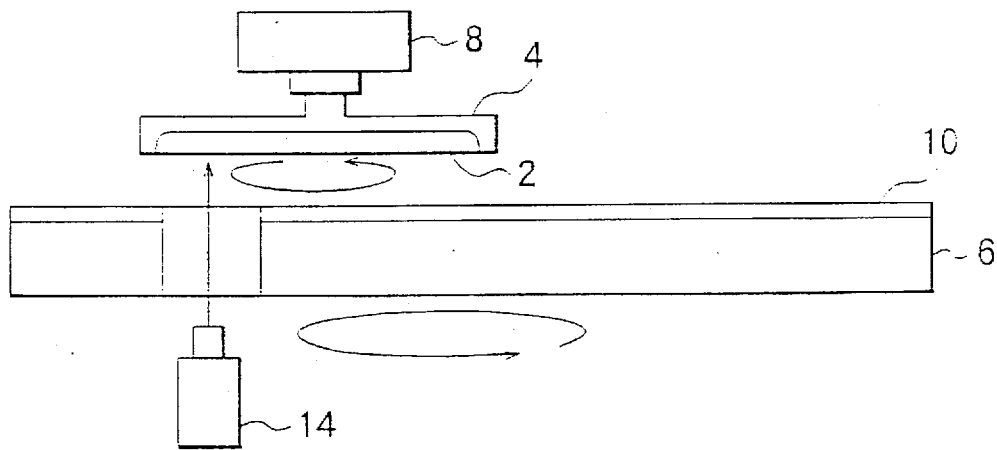

Here, before explaining the actual method for producing a semiconductor device, an explanation is provided for the apparatus for chemical mechanical polishing used for working the present invention, referring to FIG. 1A.

As shown in the figure, in the polishing apparatus used in the present embodiment, a motor 8 drives a carrier 4 on which a wafer 2 is set so that the surface of the wafer 2 faces a lathe 6. Further, although not particularly illustrated, a polishing agent is applied onto a polishing cloth 10 on the lathe 6. The polishing is carried out while adjusting the rotational speed of the lathe 6, the rotational speed of the carrier 4, and the polishing pressure pressing the carrier 4 against the lathe 6. At this time, for etching the insulation film, potassium hydroxide (KOH) and the like are added into the polishing agent and a basic atmosphere is maintained. The rotational torque of the motor 8 is monitored by an ammeter 12.

This polishing apparatus is merely one example. The method of mounting the wafer, the number and structure of the carrier 4 and the lathe 6, the type of the polishing cloth 10 and the polishing agent, and so forth are not particularly limited.

First Embodiment

The first embodiment is an embodiment wherein a trench element separation structure is formed by the method for providing the semiconductor device according to the present invention.

Figure 2A:
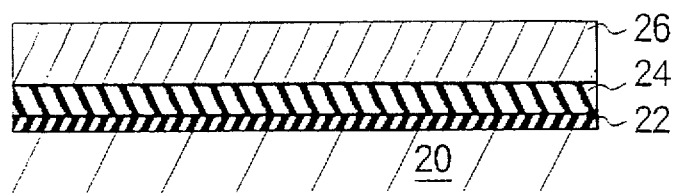
FIGS. 2A to 2D are schematic sectional views showing steps for manufacturing the semiconductor device according to the first embodiment of the present invention.

First, as shown in FIG. 2A, a 5 nm thermal oxidation film 22 made of silicon oxide, for example, was formed on a semiconductor substrate 20 made of monocrystalline silicon and the like, for protection of the surface. For forming the thermal oxidation film 22, a thermal oxidation furnace having a temperature of 850° C. was used.

Next, as shown in the same figure, a silicon nitride film 24 of 100 nm, for example, was formed and a polycrystalline silicon film 26 of 200 nm was formed on the film 22 or the substrate 20.

Figure 2B:
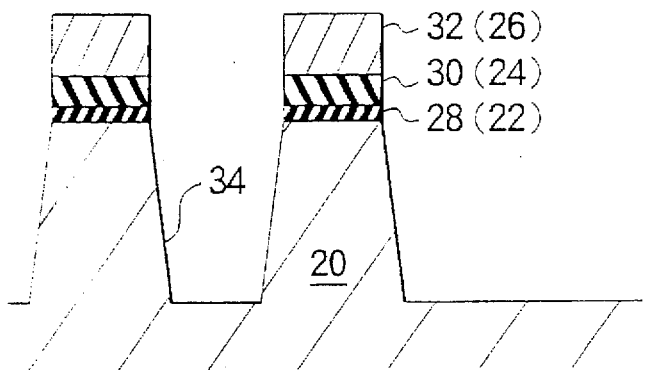

Next, as shown in FIG. 2B, a patterned resist was used as a mask for three-stage etching to successively etch the polycrystalline silicon film 26, the silicon nitride film 24, and the thermal oxidation film 22. A protective layer 28 made of the thermal oxidation film 22, a stopper layer 30 made of the silicon nitride film 24, and an intermediate layer 32 made of the polycrystalline silicon film 26 were respectively formed in order from the substrate 20. The stopper layer 30 and intermediate layer 32 have different polishing rates in the polishing step explained later. The thickness of the intermediate layer 32 was set to a value suited for the detection of the end point for polishing as will be explained later.

Next, the semiconductor substrate 20 was etched, and, as shown in FIG. 2B, a trench 34, for example, of 500 nm was formed.

Figure 2C:
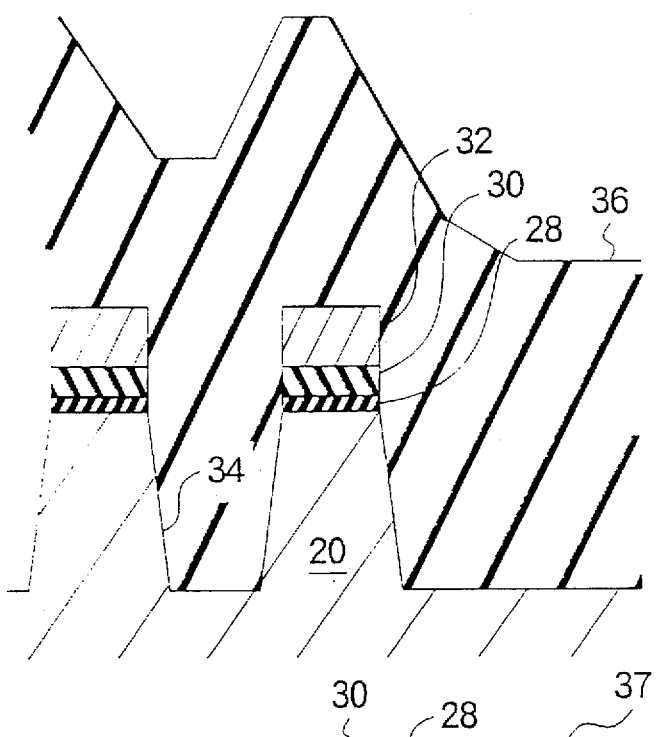
Figure 2D:
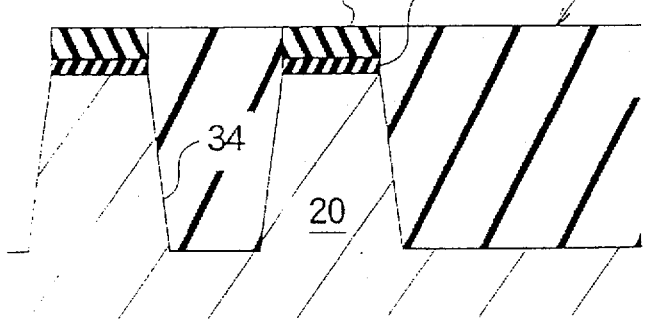

Thereafter, although not illustrated, in the trench 34, a thermal oxidation film of 10 to 30 nm made, for example, or silicon oxide was formed in a thermal oxidation furnace of 950° C. and so forth. Then, as shown in FIG. 2C, for example, a silicon oxide film 36 of 1000 nm was deposited as the layer 36 to be polished by a bias ECR-CVD process, and the interior of the trench 34 was completely filled with the insulating substance.

Next, chemical mechanical polishing was carried out by using the polishing apparatus shown in FIG. 1A. The polishing conditions at this time were as shown in the following Table 1. These polishing conditions are general polishing conditions for an insulation film. Here, as the polishing agent, fumed silica was used. To this polishing agent, as previously explained, KOH was added. As the polishing cloth, a polishing cloth-compressed urethane pad (Asker-C= 90) was used.

TABLE 1

| Rotational speed of lathe | 50 rpm |
|---|---|
| Polishing pressure | 500 g/cm² |
| Polishing agent | Fumed silica |
| Polishing cloth | Polishing cloth-compressed urethane pad |

When the chemical mechanical polishing is carried out under such conditions, the silicon oxide film 36 on the surface side of the wafer 2 is chemically or mechanically removed from the swelled portion on the projecting portion of the step difference caused by the trench and gradually planarized. Then, when the polycrystalline silicon film 26 of the intermediate layer 32 is exposed at the surface, the polishing is advanced toward the stopper layer 30 made of the silicon nitride 24 while removing the polycrystalline silicon film 26 at this time.

Next, an explanation will be made of how the end point of the chemical mechanical polishing is detected. During the polishing step, the current value of the ammeter 12 is monitored. The change of this current value is shown in FIG. 3B. During the time when the silicon oxide film 36 is polished, the current value is a relatively high level, but when the polishing shifts to the polycrystalline silicon film 26, it is abruptly lowered. Thereafter, the current value moves at a low level for a while and then when the polishing shifts to the silicon nitride film 24, the current value increases to a further higher level than the first value.

The transition of this current value corresponds to the polishing rate of the film to be polished. Namely, it reflects the fact that the polishing rate of the polycrystalline silicon film 26 is 10 to 15 times higher than that of the silicon oxide film 36 and 30 to 75 times higher than that of the silicon nitride film 24. This is because, where the rotational speed of the motor 8 is made constant, the abrasion from the polishing becomes larger in the film having a slower polishing rate and also the load (rotational torque) applied on the motor 8 is increased.

Further, the time interval during which the current value moves at a low level corresponds to the thickness of the intermediate layer 32 made of the polycrystalline silicon film 26. To detect the end point with good precision, the intermediate layer 32 must be thick to a certain extent. Conversely, when the intermediate layer 32 is too thick, however, the step difference becomes larger and the amount of polishing is increased. Thus, it is sufficient that the thickness of the intermediate layer 32 is such that the difference between polishing rates is sufficiently reflected in the fluctuation of the rotational torque to be easily noted. The thickness is preferably 0.2±0.1 μm in the first embodiment.

In the first embodiment, the rotational torque of the polishing machine was monitored by the current value of the ammeter 12, and a fluctuation of the current value of a predetermined value or more was detected as the polishing end point. More specifically, as shown in FIG. 3B, the detection level L was set and the point when the current value becomes the detection level L or less, that is, the point of intersection of the falling line (a–b) of the current value and the detection level L, was defined as the end point of the polishing.

When the polishing apparatus is stopped at the polishing end point, some of the polycrystalline silicon film 26 sometimes remains. Accordingly, it is also possible to perform additional polishing for exactly a predetermined time and then stop the polishing apparatus. Similarly, it is also possible to detect the end point by using the rising line (c–d) of the current value. Further, it is also possible to use the magnitude of the degree of acceleration with which the current value changes so as to detect a fluctuation of the current value of a predetermined value or more.

Figure 3A:
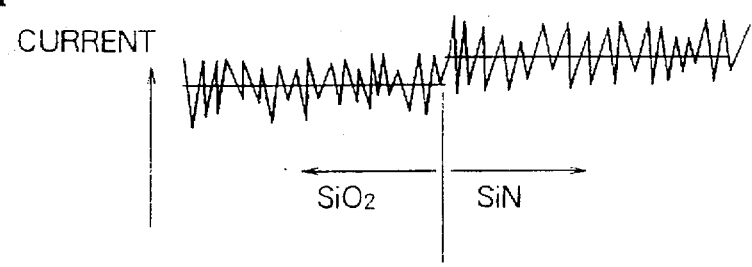
FIGS. 3A and 3B are graphs views showing the transition of the current value of the motor used for polishing in the polishing step of the present invention, where
Figure 3B:
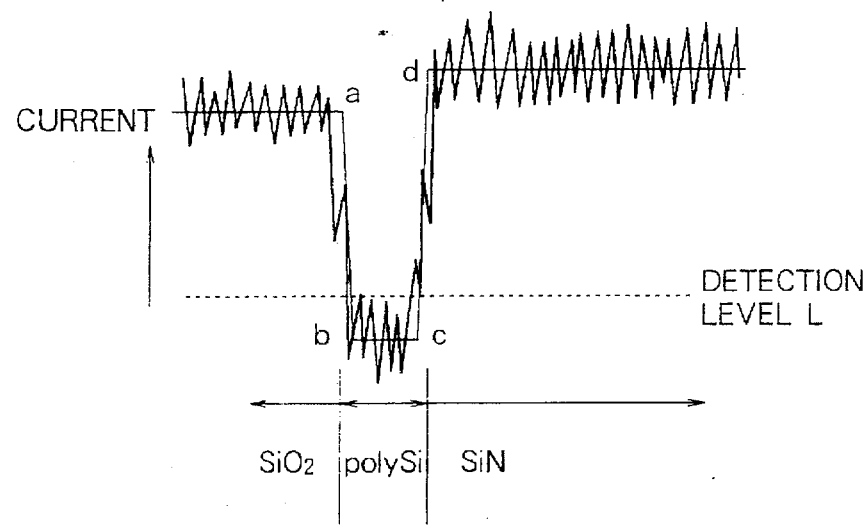

For comparison, the change of the current value where there is no intermediate layer 32 made of the polycrystalline silicon film 26 is shown in FIG. 3A. The ratio of the polishing rate of the silicon oxide film 36 with respect to the silicon nitride film 24 is about 3 to 5 and lower than the ratio with respect to the polycrystalline silicon film 26 by one order. For this reason, as shown in FIG. 3A, the level change of the current value becomes finer. When comparing this with FIG. 3B, the effect of inserting the polycrystalline silicon film 26 clearly appears also in the change of the current value.

It is also possible to detect the end point of the polishing by an interference color which changes in accordance with the thickness of the remaining film. During the step of polishing, a taper is formed near, for example, the circumferential edge of the projecting portion for either of the silicon oxide film 36 or the polycrystalline silicon film 26. A color change due to interference based on the thickness of the remaining film appears. The degree of this color change may be watched by the naked eye to detect the end point.

Further, it is also possible to optically detect the interference color. In general, when the interference color of the polycrystalline silicon film 26 is used, the detection of the end point is easy. This is because the polycrystalline silicon film 26 has a slow polishing rate and accordingly also the degree of the color change is large. In addition, the degree of the color change of the lower stopper layer 30 is small. Therefore, it is easy to distinguish between them.

Even if the polishing is continued as it is, after the silicon nitride film 24 having the slow polishing rate is exposed at the surface, the film 24 acts as a stopper, so the polishing does not proceed much further. Thus, the surface state of the planarized surface 37 of the silicon oxide film 36 can be maintained with its good planarity.

Finally, the silicon nitride film 24 exposed at the surface is removed by phosphoric acid ($H_3PO_4$) to complete the trench element separation. At this time, the amount of projection of the silicon oxide film 36 filling the trench 34 is able to be matched with the thickness of the silicon nitride film 24. This was because the silicon nitride film 24 effectively acted as a stopper in the step of the chemical mechanical polishing described above so polishing did not continue to advance. Therefore, the shape of the element separation structure can be made uniform. Further, using the protective layer 28, it was possible to protect the surface of the semiconductor substrate 20 and prevent surface roughness.

After polishing, the usual steps, for example, of forming transistors and so forth on the surface of the semiconductor substrate 20 and interconnection can be performed.

In the polishing step, if there is a difference of pattern size in the projecting portions of step differences, there sometimes occurs a variation in the amount of polishing in accordance with this pattern size. In general, in the chemical mechanical polishing, while the chemical polishing is easily carried out at projecting portions having a relatively small pattern size, at recessed portions having a large pattern size there is insufficient permeation of the polishing agent and the chemical polishing becomes difficult. If the variation of the amount of polishing is caused by how the chemical polishing is performed in this way, there should exist a tendency for the variation to become more conspicuous as polishing time increases.

To examine this tendency, the relationship between the pattern sizes of the projecting portions and the polishing rate was found. The results were graphed in FIG. 4A. As the samples, as shown in FIG. 4B, step differences of various pattern sizes were formed on a silicon substrate and covered by a silicon oxide film.

Figure 4A:
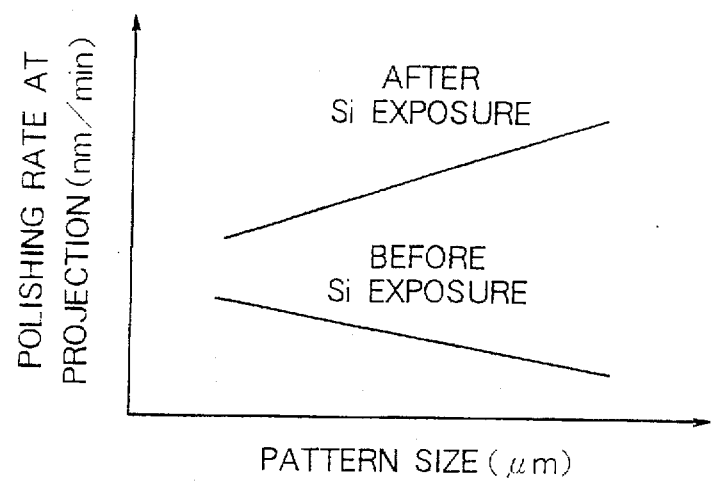
FIG. 4A is a graph showing the relationship between the polishing rate and the type of the layer to be polished or the surface area of the projecting portion.
Figure 4B:
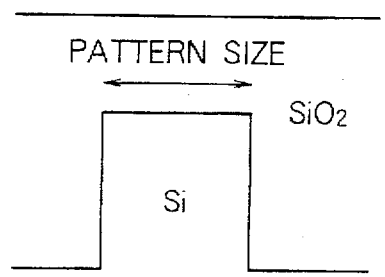
FIG. 4B is a schematic sectional view of a sample used in practicing the invention.

As a result, as shown in FIG. 4A, in the case of silicon oxide, which is relatively hard, and thus has a slow polishing rate before Si exposure, it was confirmed that the polishing rate tended to become slower in the projecting portions having a larger pattern size compared with projecting portions having a smaller pattern size.

However, as shown in FIG. 4A, it was also found that if the silicon, having a slow polishing rate, is exposed (after Si exposure), this relationship was reversed. When the polishing shifts to the silicon and the polishing rate is raised, the polishing proceeds faster for a larger sized projection from the surface of the projecting portion, while projecting portions having a smaller size are protected by the projecting portions having a larger size at their peripheries and thus are difficult to polish.

The first embodiment positively utilizes this characteristic of chemical mechanical polishing. Namely, a variation of the amount of polishing which occurs during the polishing of the silicon oxide film 36, which is relatively hard, can be cancelled out during the period where the next polycrystalline silicon film 26, which is relatively soft, is polished. For this purpose, the intermediate layer made of the polycrystalline silicon film 26 must be thick to a certain extent. In the case of the first embodiment, as described before, the preferred thickness of the intermediate layer 32 is 0.2±0.1 µm. Within this range, the polished surface after the end of the polishing had an extremely good planarity.

Second Embodiment

Next, a second embodiment will be explained.

The second embodiment relates to a method for producing of a semiconductor device with which complete filling of the insulating substance (film to be polished) into the trench can be ensured even in a case which a film which is easily oxidized is selected as the intermediate layer for strict end point control.

Figure 5C:
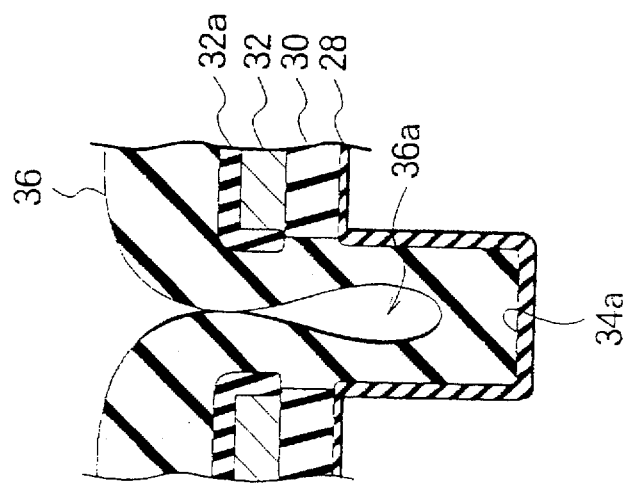
FIGS. 5A to 5C are schematic sectional views of the configuration illustrating the principal parts of the steps of FIGS. 2B and 2C in further detail.
Figure 5B:
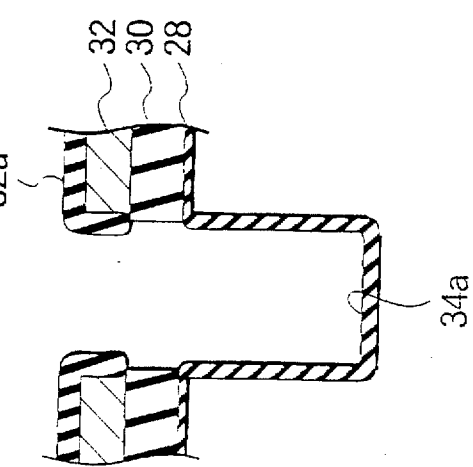
Figure 5A:
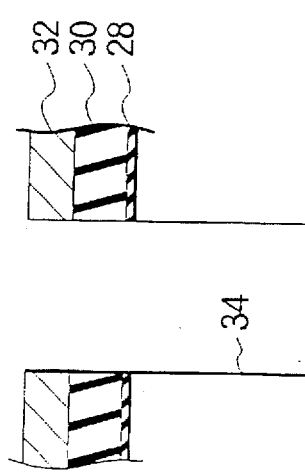

FIGS. 5A to 5C are schematic sectional views of the configuration illustrating a principal part of FIGS. 2B and 2C in the previously explained first embodiment in further detail. The parts overlapping those of FIGS. 2A to 2D are indicated by the same references and thus, duplicate explanations are omitted.

As mentioned in the first embodiment, after the intermediate layer 32, the stopper layer 30, and the protective film 28 are successively processed, the trench 34 is formed (FIG. 5A).

Thereafter, as shown in FIG. 5B, an inner wall oxidized layer 34a is formed at the inner wall of the trench 34 by a thermal oxidation process. When the silicon substrate 20 is thermally oxidized, it expands to about twice its original volume so that the width of the trench 34 becomes a little narrower. The thickness of the inner wall oxidized layer 34a is not particularly limited, but for example is about 10 to 30 nm. The inner wall oxidized layer 34a is formed for the purpose of enhancing the contact of the layer 36 to be polished when later filled in the trench 34 and for realizing a stable boundary surface between the insulating substance and semiconductor substrate 20, suppressing leakage via this boundary surface, and improving the insulation property. Further, the upper and lower corner portions of the trench are rounded for facilitating the filling of the layer 36 to be polished or the etching damage at the formation of the trench is eliminated.

Where the intermediate layer 32 is easily oxidized (where it is made of for example polycrystalline silicon), as illustrated, at this thermal oxidation, the exposed surface of the intermediate layer 32 is also oxidized, and the surface oxidized layer 32a is formed over an area from the surface side of the intermediate layer 32 to the trench opening side wall. Particularly where the intermediate layer 32 is made of polycrystalline silicon, it has a higher oxidation speed than the silicon substrate 20, so the surface oxidized layer 32a is formed thicker than the inner wall oxidized layer 34a.

In general, from the viewpoint of miniaturization, in the formation of an element separation region by a trench, not only the lithographic technology for patterning the fine regions, but also the etching technology for digging the fine trench deep and a CVD technology for filling the insulating film in this fine region are important. The limit of miniaturization is determined by all of this technology. For example, along with the miniaturization of the trench, where it is dug deep, the reaction speeds which contribute to the etching become hard to penetrate. In addition, where the insulating substance is filled in the fine region next, before the trench is filled with the insulating substance, the opening is closed by the coating film in the lateral direction of the insulating substance; thus, there is a conspicuous tendency for a void to be easily formed in the trench.

Concerning the generation of a void in this trench, as seen from FIG. 5C, when the thickness in the lateral direction of the surface oxidized layer 32a is large, the generation of the void 36a when forming the layer 36 to be polished is encouraged.

Figures 6A, 6B, 6C:
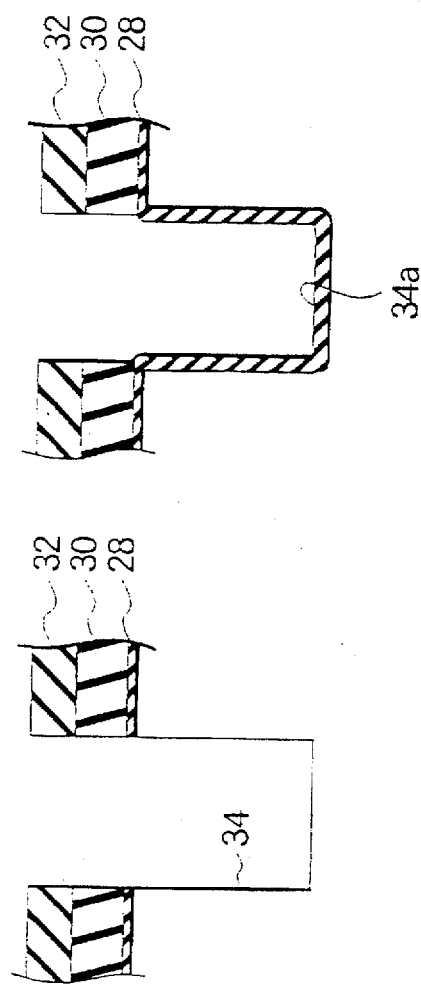
FIGS. 6A to 6C are schematic sectional views of the configuration showing a second embodiment of the present invention.

FIGS. 6A to 6C show a case where a borophosphosilicate glass (BPSG) film which is not thermally oxidized is used as the intermediate layer 32 to prevent the generation of this void 36a, even in a case where the intermediate layer 32 is provided for enhancing control of the polishing end point. At the formation of the inner wall oxidized layer 34a in FIG. 6B, the intermediate layer 32 is almost never oxidized and the opening of the trench 34 does not become narrow, so in the next film coating step of the layer 36 to be polished in FIG. 6C, the interior of the trench 34 can be completely filled with the layer 36 to be polished.

A similar effect can be obtained by preliminarily nitriding the exposed surface of the intermediate layer 32 and suppressing the formation of the surface oxidized layer 32a.

Third Embodiment

Next, a third embodiment of the present invention will be explained.

FIGS. 7A to 7D are schematic sectional views where the surface of the intermediate layer 32 is nitrided for preventing the generation of a void 36a. First, the intermediate layer 32 is patterned above the substrate portion on which the trench 34 should be formed in FIG. 7A. Then, as shown in FIG. 7B, the exposed surface of the intermediate layer 32 is preliminarily nitrided and the nitride layer 32b is formed.

As a method of the surface nitriding, thermal nitridation using a lamp annealing device using, for example, a halogen lamp as a heat source may be used. The thermal nitridation is applied for about 60 seconds under the conditions of, for example, 1000° C. and $NH_3$:1 SLM (1/min).

Further, a method of adding nitrogen (N) by an ion implantation method is used. As the ion implantation conditions in this case, for example, N ions are implanted with an energy of 3 keV and in a dosage of $1 \times 10^{15}/cm^2$.

By these steps, as shown in FIG. 7D, the surface oxidized layer 32a to be formed on the surface of the intermediate layer 32 can be suppressed to about ¼ compared with the inner wall oxidized layer 34a in the trench 34. This is because the diffusion of ions is suppressed by the formation of the silicon nitride film due to the thermally nitriding or the addition of nitrogen by ion implantation, and the progress of oxidation is prevented. Thus, the formation of void 36a is suppressed from forming in the trench 34 at the coating of the layer 36 to be polished in the next step (not shown).

By using the polishing apparatus shown in FIG. 1A, in the same way as the first embodiment, the chemical mechanical polishing can be carried out for the layer 36 to be polished and the intermediate layer 32 until the stopper layer 30 is exposed at the surface. The principles of detection of terminal point and the planarization are similar to those of the case of the first embodiment.

Fourth Embodiment

Further, a fourth embodiment of the present invention will be explained.

The fourth embodiment is an embodiment wherein an insulation film is filled between the interconnections and the surface is planarized by the method of production of the semiconductor device according to the present invention.

First, on the underlying insulation film 40 made of silicon oxide, an interconnection layer made of a copper-containing aluminum alloy (Al—Cu) was deposited to 500 nm by a sputtering process. On this layer, for example, a silicon oxide film was formed by the CVD process to 100 nm. Further, for example, a tungsten (W) film was formed by the CVD process to 200 nm.

Figure 8A:
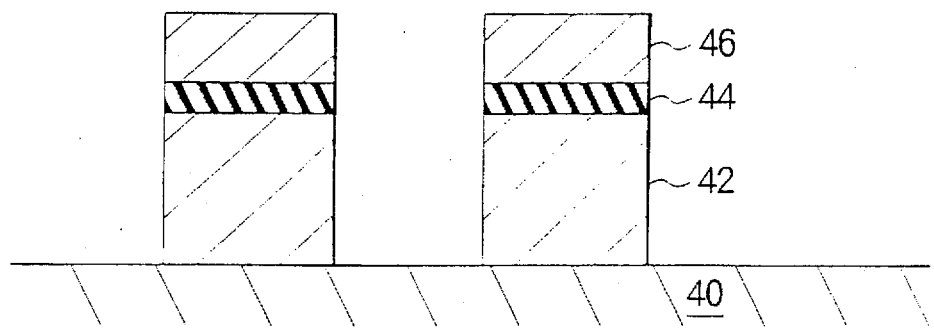
FIGS. 8A to 8C are schematic sectional views showing the manufacturing steps of a semiconductor device according to a fourth embodiment of the present invention.
Figure 8B:
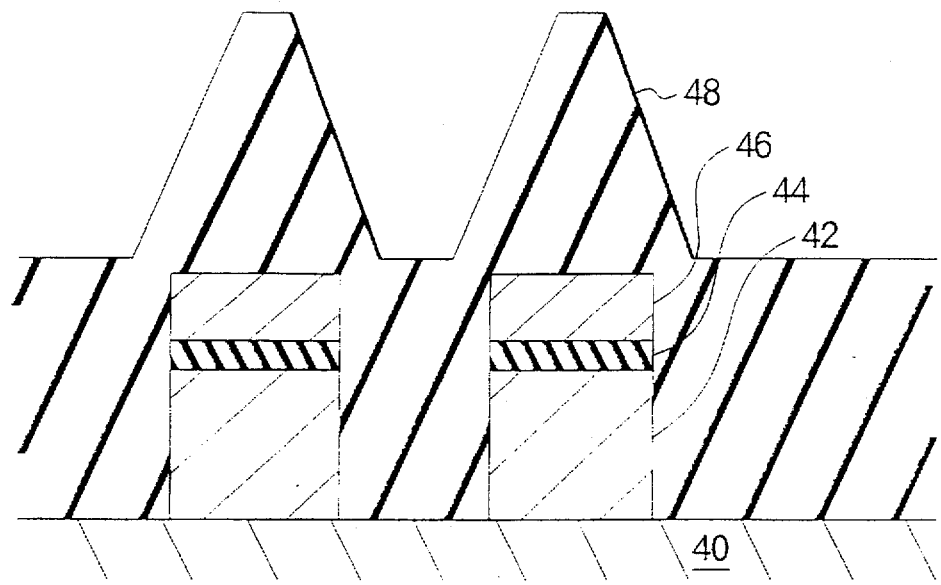

Next, as shown in FIG. 8A, by using the patterned resist as the mask, the W, silicon oxide, and Al—Cu were successively processed by dry etching. Due to this, on the interconnection pattern 42 made of Al—Cu, a stopper layer 44 made of a silicon nitride film and an intermediate layer 46 made of a polycrystalline silicon were simultaneously formed. Here, as the intermediate layer 46, a material which can give selectivity can be adopted. In the fourth embodiment, the W film is used because of the fact that the temperature at the formation of the film is low and the influence on the interconnection pattern 42 is small. Accordingly, when there is no concern over the influence upon the interconnection pattern 42, it is also possible to use a polycrystalline silicon film. Also, if selectivity can be obtained, a BPSG film can be used. When polishing the W film, in addition to the KOH, hydrogen peroxide was added. Thereafter, as shown in FIG. 8B, the bias ECR/CVD process was used to deposit, for example, a silicon oxide film to 1000 nm as the layer 48 to be polished. The spaces in the interconnection pattern 42 were completely filled with the insulating substance.

Figure 8C:
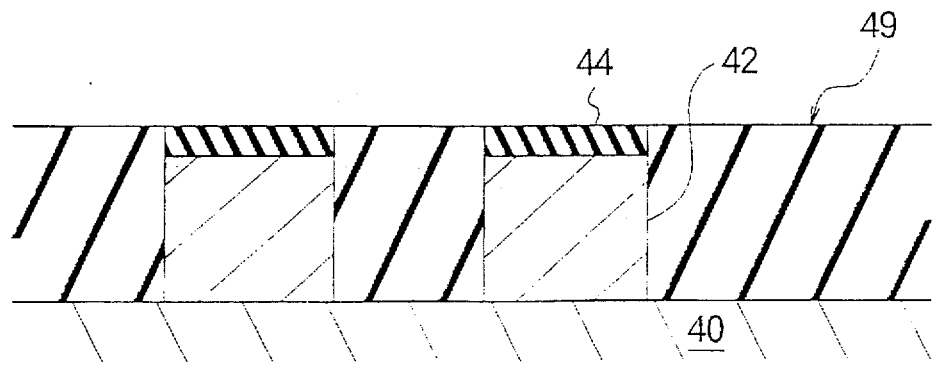

Next, the polishing apparatus shown in FIG. 1A was used in the same way as in the first embodiment to carry out chemical mechanical polishing of the layer 48 to be polished and the intermediate layer 46 until the stopper layer 44 was exposed at the surface. The principles of the detection of the end point and planarization are similar to those of the first embodiment. Therefore, as shown in FIG. 8C, a planarized surface 49 of the silicon oxide film can be obtained, and the subsequent steps, for example the formation of the interconnection pattern of the second layer, can be easily carried out.

As explained above, in the fourth embodiment, a method can be provided for producing a semiconductor device forming a structure which effectively performs the detection of the end point of polishing and simultaneously has a stopper function of a large selectivity.

Also, it is possible to cancel out the variation in polishing due to the pattern size at the chemical mechanical polishing in the polishing step and finally obtain an extremely good planarity. In addition, damage at the polishing is prevented.

Further, where the fourth embodiment is used for trench element separation, the generation of voids in the trench accompanying the miniaturization of the trench can be prevented as much as possible. Further, it is possible to adjust the amount of projection of the layer to be polished to the remaining film thickness of the stopper layer having a slow polishing rate and make the finished shape of the element separation structure uniform.

What is claimed is:

1. A method of producing a semiconductor device comprising:

forming an intermediate layer on a semiconductor substrate;

forming a projecting portion of a step difference on said substrate, said projecting portion having said intermediate layer thereon;

forming an insulating film to be polished having a slower polishing rate than said intermediate layer, said film covering the intermediate layer and filling a recessed portion of said step difference; and polishing said film to expose said intermediate layer.

2. A method of producing a semiconductor device as set forth in claim 1, wherein the polishing comprises chemical mechanical polishing.

3. A method of producing a semiconductor device as set forth in claim 1, further comprising forming a stopper layer on said substrate, under said intermediate layer, said stopper layer having a slower polishing rate than that of said film to be polished and being provided on the projecting portion of the step difference.

4. A method of producing a semiconductor device as set forth in claim 1, further comprising:

monitoring a rotational torque of a polishing machine;

indicating an end of said polishing upon detection of a fluctuation of the rotational torque equal to or exceeding a predetermined value.

5. A method of producing a semiconductor device as set forth in claim 3, further comprising:

monitoring a rotational torque of a polishing machine;

indicating an end of said polishing upon detection of a fluctuation of the rotational torque equal to or exceeding a predetermined value.

6. A method of producing a semiconductor device comprising:

forming an layer on a semiconductor substrate;

forming a projecting portion of a step difference on said substrate, said projecting portion having said layer thereon;

forming a film to be polished, said film covering the layer and filling a recessed portion of said step difference;

polishing said film to expose said layer; and determining a completion of said polishing by detecting a change in color of either said film or said layer in accordance with a remaining thickness thereof.

7. A method of producing a semiconductor device as set forth in claim 3, wherein the intermediate layer is made of polycrystalline silicon, the film to be polished is made of silicon oxide, and the stopper layer is made of silicon nitride.

8. A method of producing a semiconductor device as set forth in claim 1, wherein the step difference is a trench of the semiconductor substrate for trench element separation.

9. A method of producing a semiconductor device as set forth in claim 3, further comprising forming a protective layer, under said stopper layer, for protecting the semiconductor substrate, said projecting portion of the step difference having said protective layer thereon.

10. A method of producing a semiconductor device as set forth in claim 3, wherein the intermediate layer is made of a borophosphosilicate glass film (BPSG film), the film to be polished is made of silicon oxide, and the stopper layer is made of silicon nitride.

11. A method of producing a semiconductor including the steps of:

forming an intermediate layer providing an opening above an element separation region of the semiconductor substrate by laminating materials constituting a protective layer for protecting the surface of the semiconductor substrate, a stopper layer, and an intermediate layer on the semiconductor substrate in that order and then patterning the polycrystalline silicon film as the material constituting the intermediate layer;

nitriding the exposed surface of the formed intermediate layer and then processing the materials of the stopper layer and protective layer to extend the opening of the intermediate layer to the semiconductor substrate;

forming a trench for the separation of an element on the semiconductor substrate exposed at the surface via the opening; and thermally oxidizing the inner wall of the formed trench, forming a layer to be polished having a slower polishing speed than that of the intermediate layer and faster polishing speed than that of the stopper layer in a manner covering the intermediate layer and filling the interior of the trench, and then performing chemical mechanical polishing over an area from the layer to be polished to the intermediate layer.

12. A method of producing a semiconductor device as set forth in claim 1, wherein said intermediate layer is formed with a thickness of 0.2±0.1 μm.

13. A method of producing a semiconductor device as set forth in claim 3, wherein said stopper layer has a slower polishing rate than said film.

14. A method of producing a semiconductor device as set forth in claim 3, further comprising:

monitoring a rotational torque of a polishing machine;

detecting when said rotational torque reaches a predetermined value; and indicating an end of said polishing when said rotational torque is detected as reaching said predetermined value a second time.

15. A method of producing a semiconductor device as set forth in claim 1, wherein following said forming a projecting portion of a step difference, said intermediate layer remains only on said projection portion.

* * * * *